US011842626B1

United States Patent
Piazza et al.

(10) Patent No.: US 11,842,626 B1
(45) Date of Patent: *Dec. 12, 2023

(54) VIBROTACTILE ACTUATORS ON TEXTILES AND RELATED SYSTEMS AND METHODS

(71) Applicant: META PLATFORMS TECHNOLOGIES, LLC, Menlo Park, CA (US)

(72) Inventors: Daniele Piazza, Redmond, WA (US); Tristan Thomas Trutna, Portland, OR (US); Charles Stewart, Woodinville, WA (US); David R Perek, Bothell, WA (US); Slava Karulin, Bellevue, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 240 days.

This patent is subject to a terminal disclaimer.

(21) Appl. No.: 17/234,727

(22) Filed: Apr. 19, 2021

Related U.S. Application Data

(63) Continuation of application No. 16/794,705, filed on Feb. 19, 2020, now Pat. No. 11,011,033.

(60) Provisional application No. 62/845,852, filed on May 9, 2019.

(51) Int. Cl.
| | |
|---|---|
| G08B 6/00 | (2006.01) |
| G06F 3/01 | (2006.01) |
| G06F 1/16 | (2006.01) |
| H05K 1/03 | (2006.01) |
| H10N 30/87 | (2023.01) |
| H10N 39/00 | (2023.01) |

(52) U.S. Cl.
CPC ............... *G08B 6/00* (2013.01); *G06F 1/163* (2013.01); *G06F 3/016* (2013.01); *H05K 1/038* (2013.01); *H10N 30/872* (2023.02); *H10N 39/00* (2023.02); *H05K 2201/10083* (2013.01)

(58) Field of Classification Search
CPC .................. G06F 3/016; H05K 1/038; H05K 2201/10083; H10N 30/872; H10N 39/00
See application file for complete search history.

(56) References Cited

U.S. PATENT DOCUMENTS

| | | | |
|---|---|---|---|
| 11,011,033 B1* | 5/2021 | Piazza | G06F 1/163 |
| 2002/0130673 A1* | 9/2002 | Pelrine | A63H 3/365 |
| | | | 324/727 |
| 2008/0191585 A1* | 8/2008 | Pelrine | F02G 1/043 |
| | | | 310/363 |

(Continued)

OTHER PUBLICATIONS

Preinterview First Office Action received for U.S. Appl. No. 16/794,705 dated Jan. 19, 2021, 23 pages.

(Continued)

*Primary Examiner* — Quan Zhen Wang
*Assistant Examiner* — Mancil Littlejohn, Jr.
(74) *Attorney, Agent, or Firm* — Greenberg Traurig, LLP

(57) ABSTRACT

The disclosed haptic vibrotactile actuator may include a textile comprising a first major surface and a second, opposite major surface, an electrode coupled to the first major surface of the textile across at least a majority of a surface area of a first surface of the electrode, and a flexible electroactive material electrically coupled to a second, opposite surface of the electrode. Various other related methods and systems are also disclosed.

18 Claims, 13 Drawing Sheets

(56) References Cited

U.S. PATENT DOCUMENTS

2012/0141881 A1* 6/2012 Geier ............... H01M 4/40
                                              429/231.95
2016/0179199 A1* 6/2016 Levesque ........... G06F 3/016
                                              340/407.2
2018/0045184 A1* 2/2018 Must ............... F03G 7/005

OTHER PUBLICATIONS

Notice of Allowance received for U.S. Appl. No. 16/794,705 dated Feb. 3, 2021, 35 pages.

* cited by examiner

800

Couple a first surface of a first electrode to a major surface of a textile
810

↓

Electrically couple a flexible electroactive material to a second, opposite surface of the first electrode
820

↓

Electrically couple a second electrode to a surface of the flexible electroactive material opposite the first electrode
830

VIBROTACTILE ACTUATORS ON TEXTILES AND RELATED SYSTEMS AND METHODS

CROSS REFERENCE TO RELATED APPLICATION

This application is a continuation of U.S. Non-Provisional patent application Ser. No. 16/794,705, filed on Feb. 19, 2020, which claims the benefit of U.S. Provisional Application No. 62/845,852, filed on May 9, 2019, the disclosure of each of which is incorporated, in its entirety, by this reference.

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1:
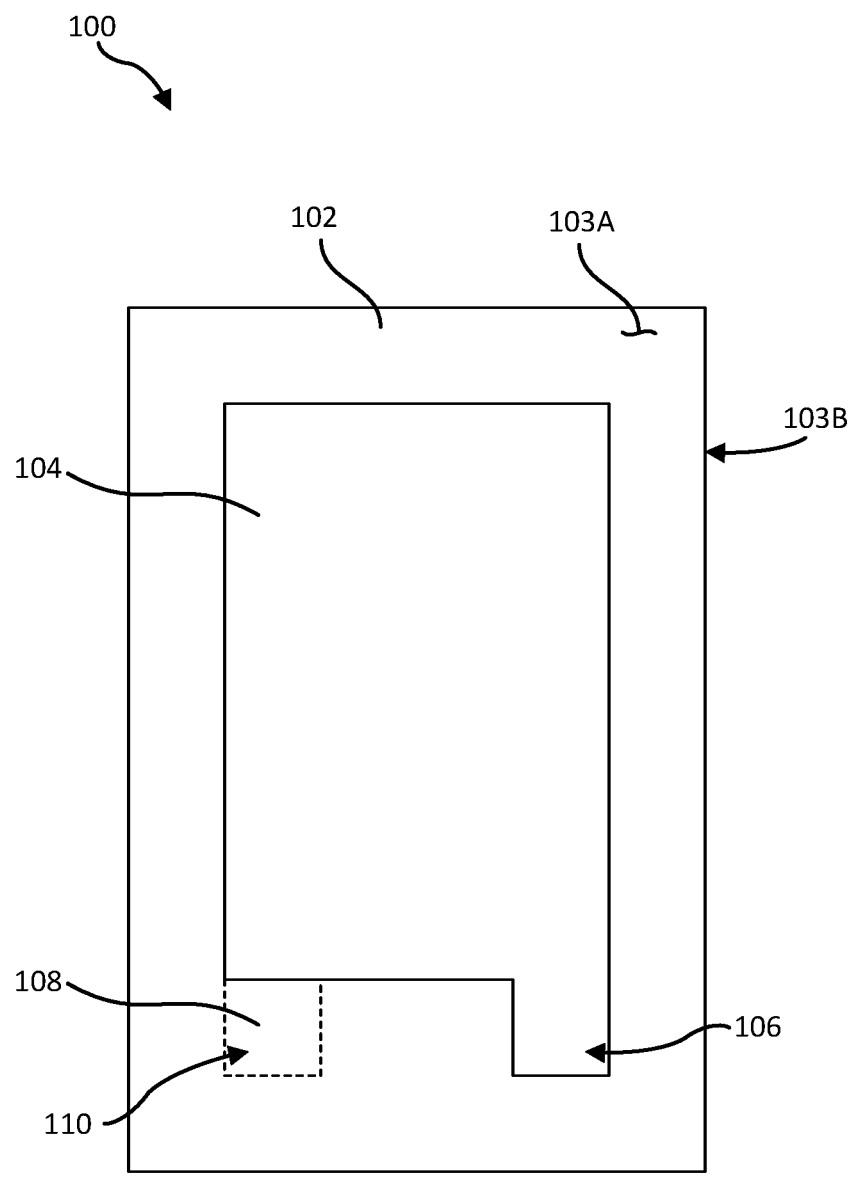
FIG. 1 is a plan view of a haptic vibrotactile actuator, according to at least one embodiment of the present disclosure.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of the appended claims.

DETAILED DESCRIPTION OF EXAMPLE EMBODIMENTS

Haptic vibrotactile devices include devices that may vibrate to provide haptic feedback to a user of a device. For example, some modern mobile devices (e.g., cell phones, tablets, mobile gaming devices, gaming controllers, etc.) include a vibrotactile device that informs the user through a vibration that an action has been taken. The vibration may indicate to the user that a selection has been made or a touch event has been sensed. Vibrotactile devices may also be used to provide an alert or signal to the user.

Various types of vibrotactile devices exist, such as piezoelectric devices, eccentric rotating mass devices, and linear resonant actuators. Such conventional vibrotactile devices may include one or more elements that vibrate upon application of an electrical voltage. In the case of piezoelectric devices, an applied voltage may induce bending or other displacement in a piezoelectric material. Eccentric rotating mass devices induce vibration by rotating an off-center mass around an axle of an electromagnetic motor. Linear resonant actuators may include a mass on an end of a spring that is driven by a linear actuator to cause vibration. Many of these conventional vibrotactile devices are rigid and inflexible.

According to some embodiments, the present disclosure is generally directed to a flexible haptic vibrotactile actuator, which may include an electroactive material positioned on, in, or over a textile. For example, the haptic vibrotactile actuator may be positioned in a palm or a finger portion of a haptic glove or in another wearable article in a position to induce haptic vibrational feedback to a user when the wearable article is donned by the user. The electroactive material may be coupled to the textile, such as by applying the electroactive material to the textile through a stencil. The combination of the electroactive material and the textile may be flexible for integration in a wearable article. Such a flexible haptic vibrotactile actuator may facilitate the fabrication thereof and/or the integration thereof in a wearable article.

In some examples, the term "textile" may include any flexible, wearable material, including woven fabric, non-woven fabric, leather, cloth, a flexible polymer material, a composite material, etc.

Figure 5:
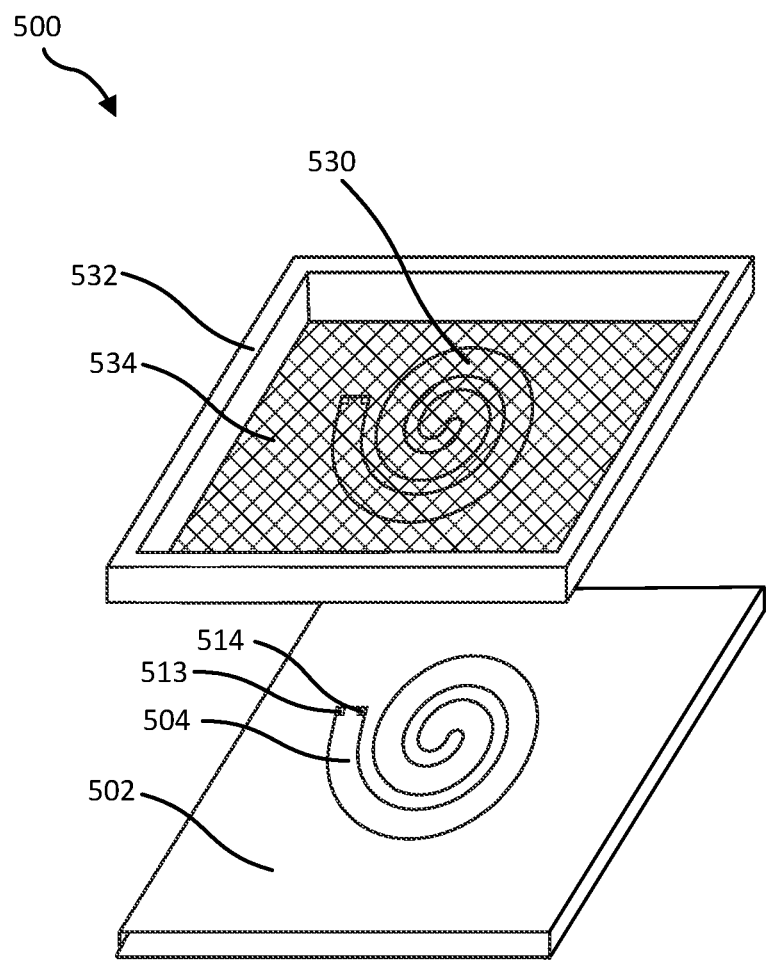
FIG. 5 illustrates an example system for coupling a haptic vibrotactile actuator to a textile, according to at least one embodiment of the present disclosure.
Figure 6:
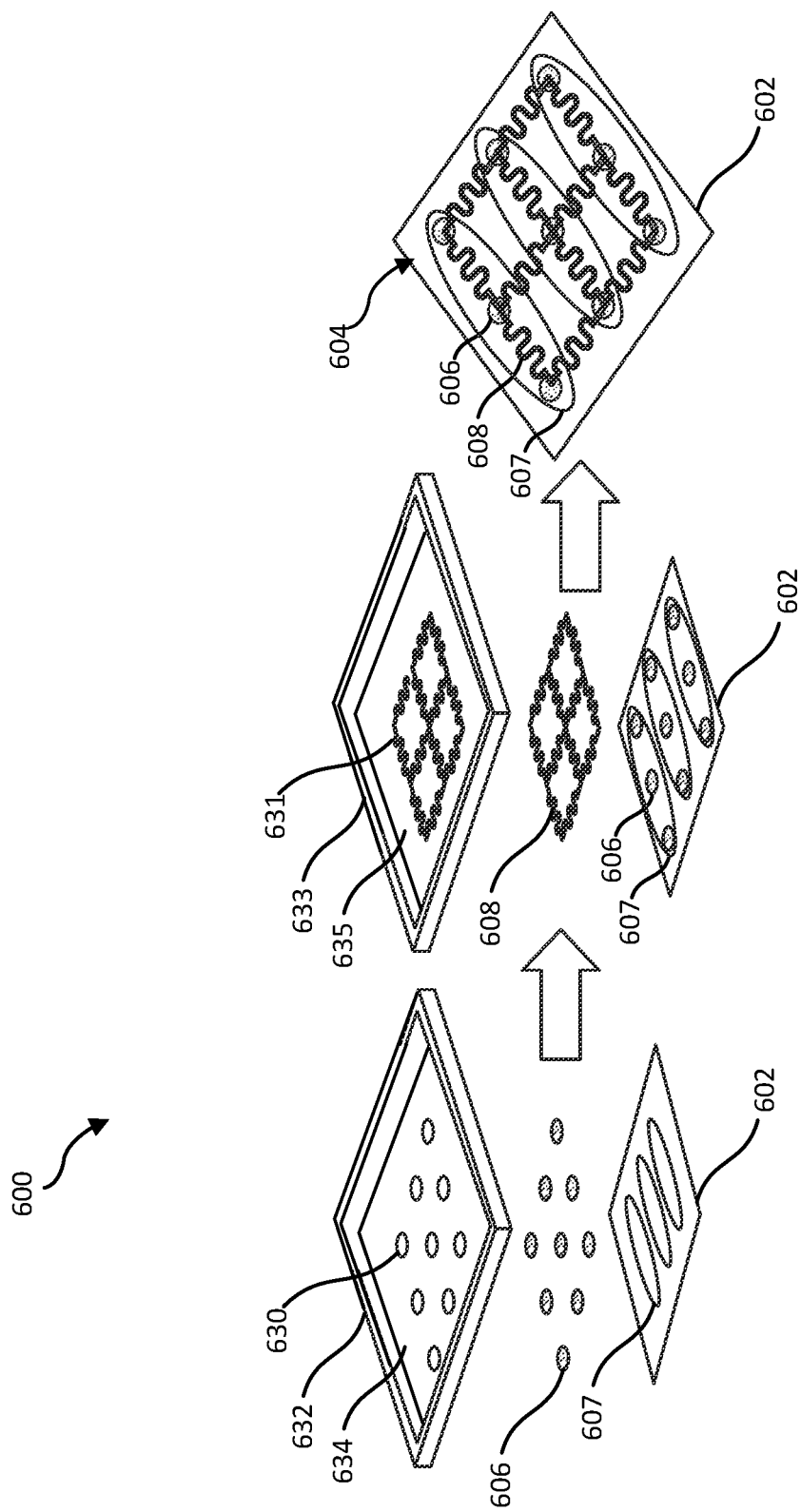
FIG. 6 illustrates an example system for coupling an array of haptic vibrotactile actuators to a textile, according to at least one embodiment of the present disclosure.
Figure 7:
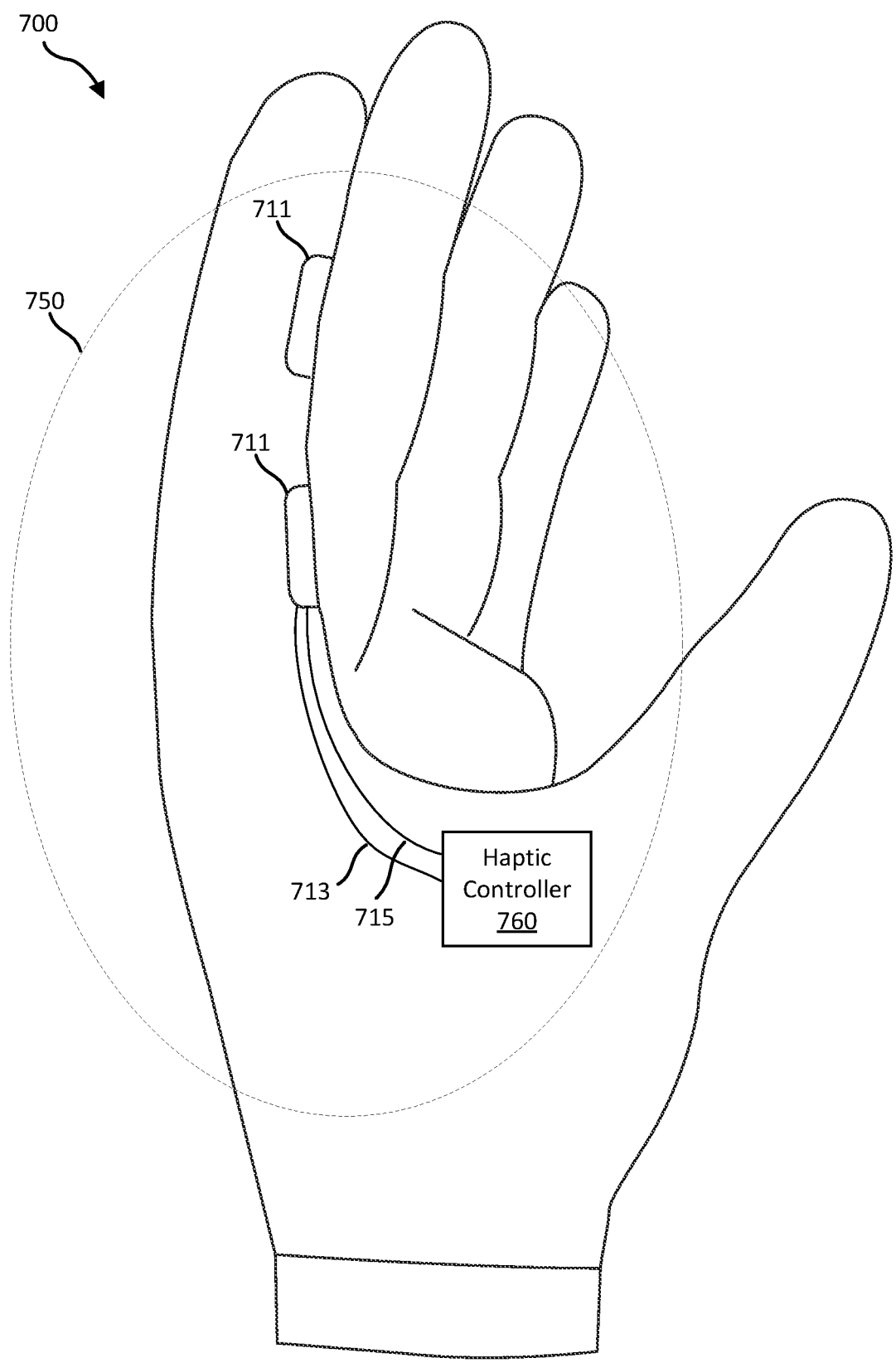
FIG. 7 illustrates an example wearable article incorporating a haptic vibrotactile actuator system, according to at least one embodiment of the present disclosure.
Figure 8:
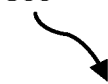
FIG. 8 is a flow diagram illustrating an example method of coupling a haptic vibrotactile actuator to a textile, according to at least one embodiment of the present disclosure.

The following will provide, with reference to FIGS. 1-13, detailed descriptions of flexible haptic vibrotactile actuators on textiles and related systems and methods. First, a description of various configurations of flexible haptic vibrotactile actuators on or in textiles and their characteristics is presented in reference to FIGS. 1-4. With reference to FIGS. 5 and 6, the following will describe systems and methods for coupling flexible haptic vibrotactile actuators to textiles. With reference to FIG. 7, the following will describe an artificial-reality system that includes flexible haptic vibrotactile actuators on textiles and a haptic controller. With reference to FIG. 8, the following will describe an example method of coupling flexible haptic vibrotactile actuators to textiles. FIGS. 9-13 illustrate various types of example artificial-reality devices and systems that may be used with a wearable article including flexible haptic vibrotactile actuators on textiles.

FIG. 1 illustrates a haptic vibrotactile actuator 100 (also referred to as "actuator 100" for simplicity) that may include a textile 102 and a first flexible electroactive material 104 positioned on, in, or over textile 102. Textile 102 may include a first major surface 103A and a second, opposite major surface 103B. First flexible electroactive material 104 may be coupled to first major surface 103A, such as across at least a majority (e.g., substantially an entirety) of a surface area of first flexible electroactive material 104. For example, an entirety of a surface area of first flexible electroactive material 104 may be continuously coupled to first major surface 103A of textile 102. As will be described in detail below with reference to FIGS. 5-6, such a continuous coupling may be accomplished by forming (e.g., depositing, applying, etc.) and/or curing (e.g., chemically curing, heat curing, and/or drying) first flexible electroactive material 104 over first major surface 103A of textile 102, and/or by otherwise adhering first flexible electroactive material 104 to first major surface 103A of textile 102.

In some examples, relational terms, such as "first," "second," "top," "bottom," etc., may be used for clarity and convenience in understanding the disclosure and accompanying drawings and may not necessarily connote or depend on any specific preference, orientation, or order, except where the context clearly indicates otherwise.

First flexible electroactive material 104 may be any suitable material that may withstand bending and deformation due to external forces (e.g., forces associated with use in a wearable article, such as a glove) without permanent damage and that is configured to deform in response to application of a sufficient voltage. By way of example and not limitation, first electroactive material 104 may include one or more of the following: an electroactive polymer material, a dielectric elastomer material, a relaxor ferroelectric material, a piezoelectric ceramic material, piezoelectric polycrystalline material, and/or a piezoelectric single-crystal material. First electroactive material 104 may have a thickness of about 150 μm or less, such as to improve a flexibility thereof (e.g., as compared to thicker electroactive materials).

Actuator 100 may also include a first electrode 106 that is electrically connected to first flexible electroactive material 104, for applying a voltage to first flexible electroactive material 104 to induce deformation (e.g., bending and/or vibrations) in first flexible electroactive material 104. By way of example and not limitation, first electrode 106 may include or may be coupled to all or a portion of first flexible electroactive material 104. In some examples, a conductive electrode material may be positioned over first flexible electroactive material 104 for applying a drive voltage (e.g., an actuating voltage) to first electroactive material 104. Similarly, a second conductive electrode material may be positioned on or adjacent to an opposing side of first electroactive material 104 to apply the voltage between the first and second conductive electrode materials.

In some embodiments, actuator 100 may optionally include a second flexible electroactive material 108, a portion of which is illustrated in FIG. 1 by dashed lines. Second flexible electroactive material 108 may include any of the electroactive materials and configurations as described with reference to first flexible electroactive material 104 and/or with reference to FIGS. 3 and 4. By way of example and not limitation, second flexible electroactive material 108 may be coupled to second major surface 103B of textile 102, such as across at least a majority of a surface area of second flexible electroactive material 108. In additional examples, second flexible electroactive material 108 may be coupled to first major surface 103A of textile 102, such as between first flexible electroactive material 104 and textile 102. A second electrode 110 may be located and configured for applying a drive voltage to first and/or second flexible electroactive materials 104, 108.

Thus, actuator 100 may include a single electroactive material (e.g., first flexible electroactive material 104) in a so-called "unimorph" configuration, or may optionally include first electroactive material 104 and second flexible electroactive material 108 in a so-called "bimorph" configuration. In embodiments in which actuator 100 is configured as a bimorph, an electrically conductive (e.g., ground, electrode, etc.) material and/or an electrically insulating material may be positioned between first and second flexible electroactive materials 104, 108.

Although FIG. 1 illustrates actuator 100 having a substantially rectangular shape, the present disclosure is not so limited. For example, haptic vibrotactile actuators of the present disclosure may have a substantially spiral shape (such as elliptical spiral, double spiral (e.g., spiraling in toward the center and out toward the edge), triangular spiral, hexagonal spiral, heptagonal spiral, octagonal spiral, etc.), a circular shape, an elongated shape, an irregular shape, an elliptical shape, a triangular shape, etc. The shape of actuator 100 may be selected in consideration of an intended use and/or an intended location on a wearable article.

Haptic vibrotactile actuator 100 described above may be incorporated in a wearable article (e.g., a glove, a headband, a sleeve, a bracelet, a watch band, a neck band, a sock, a shoe, a hat, etc.), such as any of the wearable articles described below with reference to FIGS. 9-13. Haptic vibrotactile actuator 100 may be incorporated in the wearable article in a position to induce haptic vibrational feedback to a user when the wearable article is donned by the user.

Figure 2:
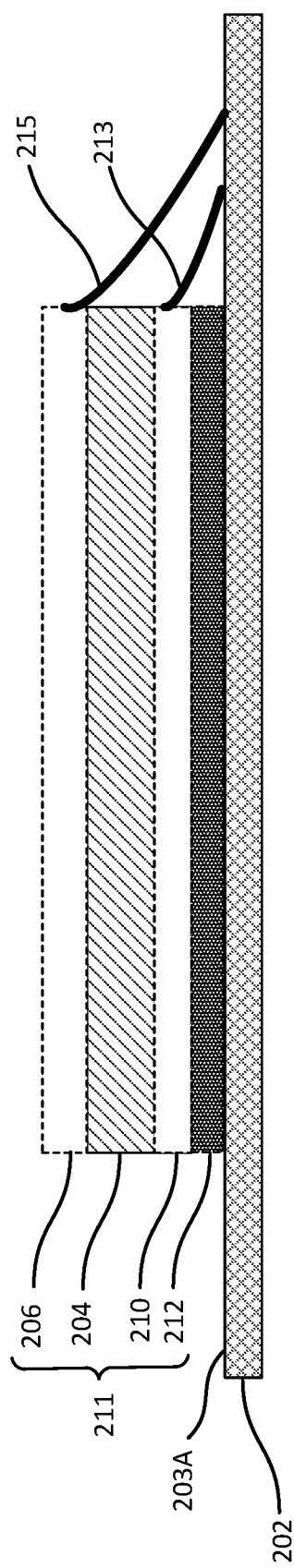
FIG. 2 is a cross-sectional view of a haptic vibrotactile actuator coupled to a textile, according to at least one embodiment of the present disclosure.

FIG. 2 illustrates a cross-sectional view of a textile 202 including a haptic vibrotactile actuator 211, according to at least one embodiment of the present disclosure. Textile 202 may include haptic vibrotactile actuator 211 coupled to a surface 203A (e.g., a major surface) of textile 202. As described below with reference to FIG. 4, textile 202 may further include another haptic vibrotactile actuator coupled to another major surface of textile 202 (e.g., to a bottom surface of the textile 202 from the perspective of FIG. 2). Haptic vibrotactile actuator 211 may include a flexible support material 212 positioned between a first electrode 210 and surface 203A of textile 202. Flexible support material 212 may be a non-porous material. The flexible support material 212, if present, may facilitate the fabrication of haptic vibrotactile actuator 211 and coupling thereof to textile 202.

Flexible support material 212 may include any type of material that is flexible including, without limitation, polymer, plastic, elastomer, rubber, or a combination thereof. First electrode 210 may be coupled to flexible support material 212 on a surface opposite to the surface coupled to textile 202. First electrode 210 may include an electrically conductive material, such as, without limitation, copper, gold, platinum, silver, palladium, or a combination thereof.

A flexible electroactive material 204 may be coupled to first electrode 210. Flexible electroactive material 204 may be any suitable material that may withstand bending, vibrating, and/or deformation due to external forces (e.g., forces associated with use in a wearable article, such as a glove) without damage and that is configured to deform in response to application of a sufficient voltage to first electrode 210 and second electrode 206. By way of example and not limitation, flexible electroactive material 204 may include one or more of the following: an electroactive polymer ("EAP") material, a dielectric elastomer material, a relaxor ferroelectric material, a piezoelectric ceramic material, an ionic gel, a piezoelectric polycrystalline material, a piezoelectric polycrystalline material, and/or a piezoelectric single-crystal material. Flexible electroactive material 204 may have a thickness of about 150 μm or less, about 125 μm or less, about 100 μm or less, about 75 μm or less, or about 50 μm or less, such as to improve a flexibility thereof (e.g., as compared to thicker electroactive materials). In some examples, flexible electroactive material 204 may be substantially planar and/or conformant to the shape of textile 202 in the absence of an applied electrical voltage or external physical load. When a sufficient voltage is applied (e.g., via first and second electrodes 210, 206), flexible electroactive material 204 may deform out of the initial plane (e.g., in the absence of an applied voltage). Haptic vibrotactile actuator 211 may be configured to vibrate in a first direction out-of-plane relative to the substantially planar shape and/or in a second direction different from the first direction and out-of-plane relative to the substantially planar shape. Haptic vibrotactile actuator 211 may have any shape including, without limitation, a rectangular shape, a circular spiral shape, an elliptical spiral shape, or a helical shape.

Second electrode 206 may be coupled to flexible electroactive material 204 on a surface opposite to the surface coupled to first electrode 210. Second electrode 206 may include an electrically conductive material, such as, without limitation, copper, gold, platinum, silver, palladium, or a combination thereof. As shown in FIG. 2, haptic vibrotactile actuator 211 may include a single flexible electroactive material 204 positioned between first electrode 210 and second electrode 206 (with or without electrically insulating flexible support material 212) in a so-called "unimorph" configuration, or may include a first electroactive material and a second electroactive material in a so-called "bimorph" configuration as shown with reference to FIGS. 3 and 4.

Since flexible electroactive material 204 may deform, deflect, and/or vibrate when activated by an electrical voltage applied to first electrode 210 and second electrode 206, in some embodiments first electrode 210 and/or second electrode 206 may conform to the shape of flexible electroactive material 204. Thus, in some embodiments, textile 202, flexible support material 212, first electrode 210 and/or second electrode 206 may be compliant to flexible electroactive material 204. First electrode 210 and second electrode 206 may be capable of maintaining electrical contact with conductors 213, 215 (e.g., wires, a harness, etc.) to a haptic actuator controller even at the deflections and vibrations encountered with haptic vibrotactile actuators of the present disclosure. Conductors 213 and 215 may be coupled to first electrode 210 and second electrode 206 respectively. As described below with reference to FIG. 7, conductors 213, 215 may be routed on and/or through textile 202 to a haptic controller that controls an actuation voltage that may be applied to first and second electrodes 210, 206 to induce a haptic vibration in haptic vibrotactile actuator 211. The haptic vibration may render a cutaneous sensation to a user donning a wearable article that includes haptic vibrotactile actuator 211.

In some embodiments, a wearable article may include textile 202, flexible support material 212, first electrode 210, flexible electroactive material 204, and second electrode 206 in a configuration shown in FIG. 1. Textile 202, flexible support material 212, first electrode 210, flexible electroactive material 204, and second electrode 206 may substantially conform to the shape of a user's body (e.g., a hand, a finger, etc.) when the user is donning a wearable article and when the wearable article changes shape due to motion of the user's body (e.g., flexion, extension, rotation, etc.).

Figure 3:
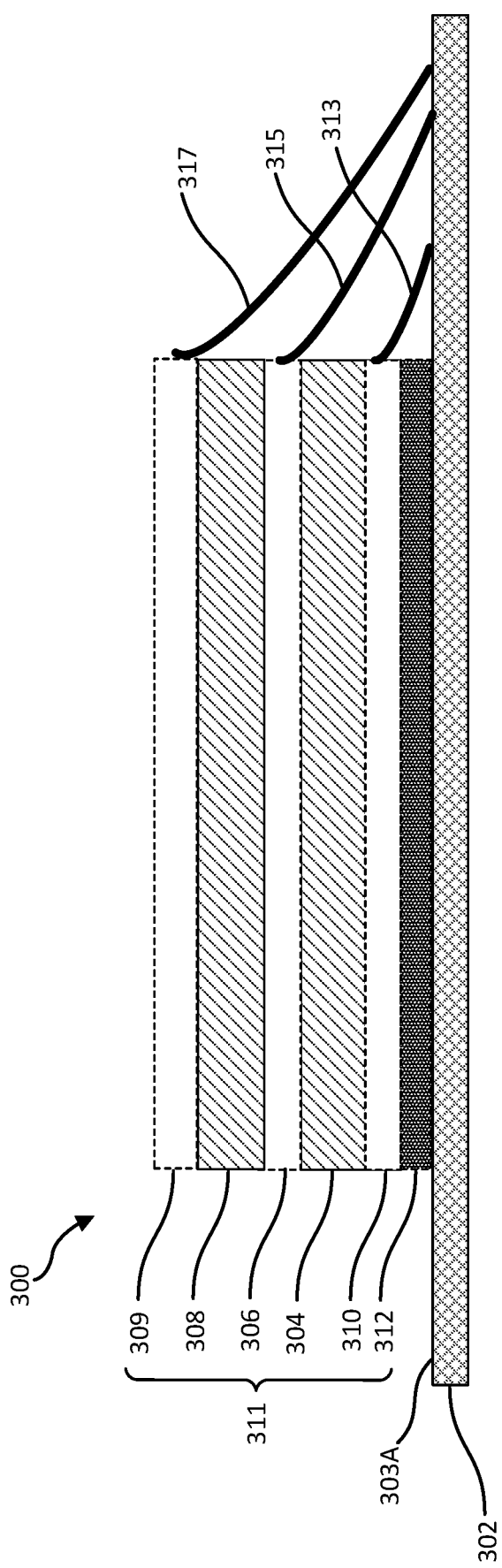
FIG. 3 is a cross-sectional view of a haptic vibrotactile actuator coupled to a textile, according to another embodiment of the present disclosure.

FIG. 3 illustrates a cross-sectional view of a textile 302 including a haptic vibrotactile actuator 311, according to at least one embodiment of the present disclosure. Haptic vibrotactile actuator 311 may be configured as a bimorph including a first flexible electroactive material 304 and a second flexible electroactive material 308. Similar to haptic vibrotactile actuator 211 described in FIG. 2, haptic vibrotactile actuator 311 may include a flexible support material 312 positioned between a first electrode 310 and a surface 303A (e.g., a top surface) of textile 302. Flexible support material 312 may be a non-porous material. Flexible support material 312 may include any type of material that is flexible including, without limitation, polymer, plastic, elastomer, rubber, or a combination thereof. First electrode 310 may be coupled to flexible support material 312 on a surface opposite to the surface coupled to textile 302. First electrode 310 may include an electrically conductive material, such as, without limitation, copper, gold, platinum, silver, palladium, or a combination thereof.

A first flexible electroactive material 304 may be coupled to first electrode 310. First flexible electroactive material 304 and second flexible electroactive material 308 may include any suitable material that may withstand bending, vibrating, and/or deformation due to external forces (e.g., forces associated with use in a wearable article, such as a glove) without damage and that is configured to deform in response to application of a sufficient voltage to first electrode 310, second electrode 306, and a third electrode 309. By way of example and not limitation, first flexible electroactive material 304 may include one or more of the following: an EAP material, a dielectric elastomer material, a relaxor ferroelectric material, a piezoelectric ceramic material, an ionic gel, a piezoelectric polycrystalline material, and/or a piezoelectric single-crystal material.

Haptic vibrotactile actuator 311 may include second flexible electroactive material 308 coupled to second electrode 306. Haptic vibrotactile actuator 311 may include third electrode 309 coupled to second flexible electroactive material 308 on a surface opposite to second electrode 306. Haptic vibrotactile actuator 311 may be configured to deform in response to application of a sufficient voltage to second electrode 306 and third electrode 309.

Conductors 313, 315, and 317 may be coupled to first electrode 310, second electrode 306, and third electrode 309 respectively. As described below with reference to FIG. 7, conductors 313, 315, and 317 may be routed on and/or through textile 302 to a haptic controller that controls an actuation voltage to induce a haptic vibration in haptic vibrotactile actuator 311. The haptic vibration may render a cutaneous sensation to a user donning a wearable article that includes haptic vibrotactile actuator 311 such as the wearable articles shown in FIGS. 7, 9, 11, and 12.

In embodiments in which haptic vibrotactile actuator 311 is configured as a bimorph, such as the configuration shown in FIG. 3, voltages may be applied in an independent or a coordinated fashion by a haptic controller to actuate (e.g., deform) first flexible electroactive material 304 and second flexible electroactive material 308. Voltages may be applied to first electrode 310 and second electrode 306 to actuate first flexible electroactive material 304 and voltages may be applied to second electrode 306 and third electrode 309 to actuate second flexible electroactive material 308. In some examples, second electrode 306 may be connected to an electrical ground. By arranging multiple layers of flexible electroactive material in parallel (e.g., stacking layers), the resulting actuation force may be multiplied and the stiffness of haptic vibrotactile actuator 311 may be increased.

Figure 4:
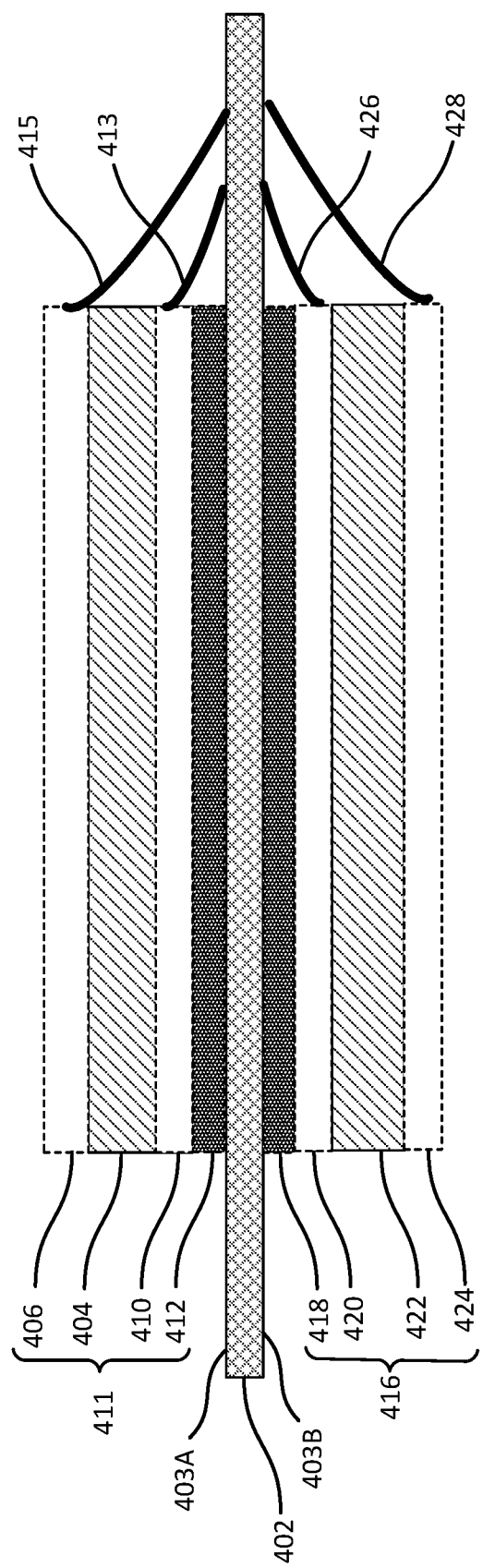
FIG. 4 is a cross-sectional view of a haptic vibrotactile actuator coupled to a textile, according to another embodiment of the present disclosure.

FIG. 4 illustrates a cross-sectional view of a textile 402 including haptic vibrotactile actuators 411 and 416, according to at least one embodiment of the present disclosure. As described above with reference to FIG. 3, a haptic vibrotactile actuator may be configured as a bimorph with multiple layers of flexible electroactive material stacked in parallel and separated by electrodes. Additionally or alternatively, textile 402 may be configured with two unimorph haptic vibrotactile actuators in which haptic vibrotactile actuator 411 is configured as a unimorph and is positioned on surface 403A (e.g., a first major surface) and haptic vibrotactile actuator 416 is configured as a unimorph and is positioned on surface 403B (e.g., a second, opposite major surface) of textile 402. Surface 403A and surface 403B may be on opposite sides of textile 402. Haptic vibrotactile actuator 411 may be configured similarly to haptic vibrotactile actuator 211 in which a flexible support material 412 is positioned between a first electrode 410 and surface 403A (e.g., a top surface) of textile 402. A first flexible electroactive material 404 may be coupled to first electrode 410 and second electrode 406 may be coupled to first flexible electroactive material 404 on a side opposite to first electrode 410. Flexible support material 412, first electrode 410, first flexible electroactive material 404, and second electrode 406 may have physical, electrical, structural, and dimensional properties similar to those described above with reference to FIG. 2.

Haptic vibrotactile actuator 416 may be positioned on surface 403B and include a structure that is a mirror image of haptic vibrotactile actuator 411. For example, second haptic vibrotactile actuator 416 may be configured similarly to haptic vibrotactile actuator 211 in which a second flexible support material 418 is positioned between a third electrode 420 and surface 403B (e.g., a bottom surface) of textile 402. A second flexible electroactive material 422 may be coupled to third electrode 420 and a fourth electrode 424 may be coupled to second flexible electroactive material 422 on a side opposite to third electrode 420. Second flexible support material 418, third electrode 420, second flexible electroactive material 422, and fourth electrode 424 may have physical, electrical, structural, and dimensional properties similar to those described above with reference to FIG. 2.

Conductors 413 and 415 may be coupled to first electrode 410 and second electrode 406, respectively. Conductors 426 and 428 may be coupled to third electrode 420 and fourth electrode 424, respectively. As described below with reference to FIG. 7, conductors 413, 415, 426, and 428 may be routed on and/or through textile 402 to a haptic controller that controls the actuation voltage to induce a haptic vibration in haptic vibrotactile actuators 411 and 416. The actuation voltages may be applied in an independent or a coordinated fashion by a haptic controller to actuate (e.g., deform) first flexible electroactive material 404 and second flexible electroactive material 422. Voltages may be applied to first electrode 410 and second electrode 406 to actuate first flexible electroactive material 404 and voltages may be applied to third electrode 420 and fourth electrode 424 to actuate second flexible electroactive material 422. By arranging haptic vibrotactile actuators 411 and 416 on opposite sides of textile 402, the resulting actuation force may be multiplied (e.g., amplified as compared to a single haptic vibrotactile actuator). The haptic vibration may render a cutaneous sensation to a user donning a wearable article that includes haptic vibrotactile actuators 411 and 416 such as the wearable articles shown in FIGS. 7, 9, 11, and 12.

FIG. 5 illustrates an example system 500 for coupling a haptic vibrotactile actuator 504 to a textile 502. Haptic vibrotactile actuator 504 may be any of haptic vibrotactile actuators 211, 311, 411, or 416 described above. In some examples, haptic vibrotactile actuator 504 may be of a configuration different from those described above. Haptic vibrotactile actuator 504 may include flexible support material(s), flexible electroactive material(s), and electrodes as described above with reference to FIGS. 1-4. Each of the flexible support material(s), flexible electroactive material(s), and electrodes may be coupled to one another and/or to textile 502 using any suitable method. In some examples, the flexible support material(s), flexible electroactive material(s), and electrodes may be coupled using a stenciling process, a sewing process, a spin-on process, a three-dimensional printing process, a silk-screening process, a lamination process, an adhesion process, a printing process, a pad-printing process, a flexographic printing process, a sputter deposition process, a chemical deposition process, or a combination thereof. In some examples, haptic vibrotactile actuator 504 may be integrated into textile 502. The flexible support material(s), the flexible electroactive material(s), and/or the electrodes may be coupled using coupling tool 532. Coupling tool 532 may couple the flexible support material(s), the flexible electroactive material(s), and/or the electrodes according to the configurations described above with reference to FIGS. 1-4. For example, a flexible support material may be coupled to textile 502, first electrode 513 may be coupled to the flexible support material, a flexible electroactive material may be coupled to the first electrode, and second electrode 514 may be coupled to the flexible electroactive material.

Coupling tool 532 may include a stencil 534 (e.g., a screen, a mold, etc.) including a pattern 530. Pattern 530 may be a cutout in stencil 534 in the shape of the haptic vibrotactile actuator to be coupled to textile 502. Although FIG. 5 shows the shape of the haptic vibrotactile actuator to be a spiral shape, the present disclosure is not so limited. In some examples, coupling tool 532 may be positioned on textile 502 such that stencil 534 is adjacent to a surface of textile 502. A material may be applied to the surface of textile 502 through pattern 530 such that the material is coupled to textile 502. The material may be applied to textile 502 using a stenciling process that forces the material through the pattern 530 onto textile 502 such that the material is coupled to textile 502 in the shape of the pattern. The material applied may be any material used to create the flexible support material(s), the flexible electroactive material(s), and/or the electrodes. In some examples, the applied material may undergo post-coupling processing, such as curing of the material (e.g., using heat and/or pressure) and/or a trimming process (e.g., laser trimming) to control the dimensions of the material. The curing may form a bond between haptic vibrotactile actuator 504 and textile 502. The process described above may be used to couple any or all of the layers used to create haptic vibrotactile actuator 504, such as the flexible support material(s), the flexible electroactive material(s), and/or the electrodes.

FIG. 6 illustrates an example system 600 for coupling an array of haptic vibrotactile actuators 604 to a textile 602. Similar to system 500 described above for coupling haptic vibrotactile actuator 504 to textile 502, system 600 may couple array of haptic vibrotactile actuators 604 to textile 602. The haptic vibrotactile actuators in array of haptic vibrotactile actuators 604 may be any of haptic vibrotactile actuators 211, 311, 411, 416, or 504 described above. In some examples, array of haptic vibrotactile actuators 604 may be a combination of different configurations and/or shapes of haptic vibrotactile actuators. Each haptic vibrotactile actuator in array of haptic vibrotactile actuators 604 may include flexible support material 607, flexible electroactive material 608, and/or electrodes 606 as described above with reference to FIGS. 1-4. Each of flexible support material 607, flexible electroactive material 608, and electrodes 606 may be coupled to one another and/or to textile 602 using any suitable method. In some examples, flexible support material 607, flexible electroactive material 608, and electrodes 606 may be coupled using a stenciling process, a sewing process, a spin-on coating process, a three-dimensional printing process, a silk-screening process, a lamination process, an adhesion process, a printing process, a pad-printing process, a flexographic printing process, a sputter deposition process, a chemical deposition process, or a combination thereof. In some examples, array of haptic vibrotactile actuators 604 may be integrated into (e.g., woven, laminated, or sewn into) textile 602. Flexible support material 607, flexible electroactive material 608, and electrodes 606 may be coupled using a first coupling tool 632 and a second coupling tool 633. First coupling tool 632 and second coupling tool 633 may couple flexible support material 607, flexible electroactive material 608, and electrodes 606 according to the configurations described above with reference to FIGS. 1-4. For example, flexible support material 607 may be coupled to textile 602, electrode 606 may be coupled to flexible support material 607, flexible electroactive material 608 may be coupled to electrode 606, and a second electrode may be coupled to flexible electroactive material 608.

System 600 may include multiple coupling tools that include different stencils for coupling different patterns (e.g., different shapes) of material to textile 602. For example, system 600 may include first coupling tool 632 that includes a first stencil 634 (e.g., a screen, a mold, etc.) including a first pattern 630. System 600 may include second coupling tool 633 that includes a second stencil 635 (e.g., a screen, a mold, etc.) including a second pattern 631. First pattern 630 may be different from second pattern 631. First coupling tool 632 may be used to apply the same or different material from the material applied with second coupling tool 633. Further, first coupling tool 632 may be used to apply a material in the same or different position on textile 602 from the position of the material applied with second coupling tool 633.

First pattern 630 and second pattern 631 may include a cutout in first stencil 634 and second stencil 635, respectively, that forms the shape of array of haptic vibrotactile actuators 604 coupled to textile 602. Although FIG. 6 shows the haptic vibrotactile actuators of array of haptic vibrotactile actuators 604 to have a serpentine shape, the present disclosure is not so limited. In some examples, first coupling tool 632 may be positioned on textile 602 such that first stencil 630 is adjacent to a surface of textile 602. A material may be applied to the surface of textile 602 through first pattern 630 such that the material is coupled to textile 602. The material may be applied to textile 602 through first pattern 630 using a stenciling process, a three-dimensional printing process, a silk-screening process, a lamination process, an adhesion process, a printing process, pad-printing, flexographic printing, a sputter deposition process, a chemical deposition process, or a combination thereof. The material applied may be any material used to create flexible support material 607, flexible electroactive material 608, or electrodes 606.

In some examples, after the material is coupled (e.g., applied) to textile 602 through the first pattern 630, first coupling tool 632 may be removed from the surface of textile 602 and second coupling tool 633 may be positioned on textile 602 such that second stencil 631 is adjacent to the surface of textile 602. A material may be applied to the surface of textile 602 through second pattern 631 such that the material is coupled to textile 602 and/or to the material applied by first pattern 630. For example, first pattern 630 may be used to apply flexible support material 607 and electrodes 606. Second pattern 631 may be used to apply flexible electroactive material 608. In some examples, first pattern 630 may be used to apply flexible support material 607 and second pattern 631 may be used to apply and electrodes 606 and flexible electroactive material 608. Any number of patterns and/or steps may be used to couple array of haptic vibrotactile actuators 604 to textile 602. The material may be applied to textile 602 through second pattern 631 using a stenciling process, a three-dimensional printing process, a silk-screening process, a lamination process, an adhesion process, a printing process, a pad-printing process, a flexographic printing process, a sputter deposition process, a chemical deposition process, or a combination thereof. The material applied may be any material used to create flexible support material 607, flexible electroactive material 608, and/or electrodes 606.

In some examples, the applied material(s) may undergo post-coupling processing including curing of the material (e.g., using heat and/or pressure) and/or a trimming process (e.g., laser trimming) to control the dimensions of the material. The process described above may be used to couple any or all of the layers used to create array of haptic vibrotactile actuators 604 including the flexible support material(s), the flexible electroactive material(s), and the electrodes.

FIG. 7 illustrates an example wearable article 700 incorporating a haptic vibrotactile actuator system 750 that may include at least one haptic vibrotactile actuator on a textile. Referring to FIG. 7, wearable article 700 (e.g., a glove) may include multiple haptic vibrotactile actuators 711 positioned in or on a textile of wearable article 700. By way of example and not limitation, wearable article 700 is illustrated in FIG. 7 as a glove. However, wearable article 700 may be any of wearable articles described in FIGS. 9-13 below or another wearable article. Wearable article 700 may include haptic vibrotactile actuator system 750 that induces haptic vibration in flexible haptic vibrotactile actuators 711 positioned on or in a textile of wearable article 700. Haptic vibrotactile actuators 711 may be any of haptic vibrotactile actuators 211, 311, 411, 416, 504, or 604. Further, haptic vibrotactile actuators 711 may be positioned on inflatable bladders to provide an enhanced vibrotactile sensation to a user donning wearable article 700 when the inflatable bladders are inflated. By having the ability to apply haptic pressure and haptic vibration independently or simultaneously, wearable article 700 may be configured to provide an increased level of control and an alternative user experience in haptic feedback, such as in an artificial-reality application. Although FIG. 7 shows two flexible haptic vibrotactile actuators 711, the present disclosure is not so limited. For example, FIG. 11 shows a wearable article with multiple flexible haptic vibrotactile actuators arranged in arrays.

Wearable article 700 may include a haptic controller 760. Haptic controller 760 may be further configured to control a haptic vibration in flexible haptic vibrotactile actuators 711 by providing a voltage signal to electrodes on opposite sides of flexible haptic vibrotactile actuators 711. Haptic controller 760 may provide the voltage signal to flexible haptic vibrotactile actuators 711 through electrical conduit 713, 715 (e.g., discrete wires or a bus). Haptic controller 760 may control the application of haptic vibration independently or simultaneously to a user donning wearable article 700. The haptic vibration may be applied to a user in connection with artificial-reality content presented to the user (e.g., artificial-reality content presented on system 1000 of FIG. 10 or system 1200 of FIG. 12). Wearable article 700 may provide an increased level of control and an alternative user experience in haptic feedback, such as in an artificial-reality application. Although haptic controller 760 is illustrated in FIG. 7 on a side of the wearable article 700, the present disclosure is not so limited. In additional examples, haptic controller 760 may be located in a different position on wearable article 700, on a different wearable article (e.g., a wristband, a head-mounted display, an armband, a vest, etc.), in a computing system that is in communication with wearable article 700, or in another location.

FIG. 8 is a flow diagram illustrating an example method 800 of coupling a haptic vibrotactile actuator to a textile. At operation 810, method 800 may include coupling a first surface of a first electrode to a major surface of a textile. Operation 810 may be performed in a variety of ways, as will be understood by one skilled in the art considering the present disclosure. For example, operation 810 may be performed according to the methods described with reference to FIGS. 1-6.

At operation 820, method 800 may include electrically coupling a flexible electroactive material to a second, opposite surface of the first electrode. Operation 820 may be performed in a variety of ways, as will be understood by one skilled in the art considering the present disclosure. For example, operation 820 may be performed according to the methods described with reference to FIGS. 1-6.

At operation 830, method 800 may include electrically coupling a second electrode to a surface of the flexible electroactive material opposite the first electrode. Operation 830 may be performed in a variety of ways, as will be understood by one skilled in the art considering the present disclosure. For example, operation 830 may be performed according to the methods described with reference to FIGS. 1-6.

Accordingly, the present disclosure includes devices, systems, and methods that may be employed to couple flexible haptic vibrotactile actuators to textiles. For example, an artificial-reality system may include a wearable article(s) that includes haptic vibrotactile actuators coupled to textiles. The haptic vibrotactile actuators on textiles may provide haptic feedback to a user when the wearable article is donned by the user. The flexible haptic vibrotactile actuator may include an electroactive material(s) that is configured to vibrate upon application of a sufficient electrical voltage thereto. The haptic vibrotactile actuators may include flexible support material(s), flexible electroactive material(s), and electrodes as described above with reference to FIGS. 1-4. Each of the flexible support material(s), flexible electroactive material(s), and electrodes may be coupled to one another and/or to the textile using any suitable method. In some examples, the flexible support material(s), flexible electroactive material(s), and electrodes may be coupled to the textile using a stenciling process, a sewing process, a spin-on process, a three-dimensional printing process, a silk-screening process, a lamination process, an adhesion process, a printing process, a pad-printing, process, a flexographic printing process, a sputter deposition process, a chemical deposition process, or a combination thereof. In some examples, the haptic vibrotactile actuators may be integrated into textiles. The haptic feedback provided to the user by the haptic vibrotactile actuators may be provided in connection with audio/video content in order to create a more compelling artificial-reality experience.

Embodiments of the present disclosure may include or be implemented in conjunction with various types of artificial-reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (e.g., augmented-reality system 900 in FIG. 9) or that visually immerses a user in an artificial reality (e.g., virtual-reality system 1000 in FIG. 10). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 9:
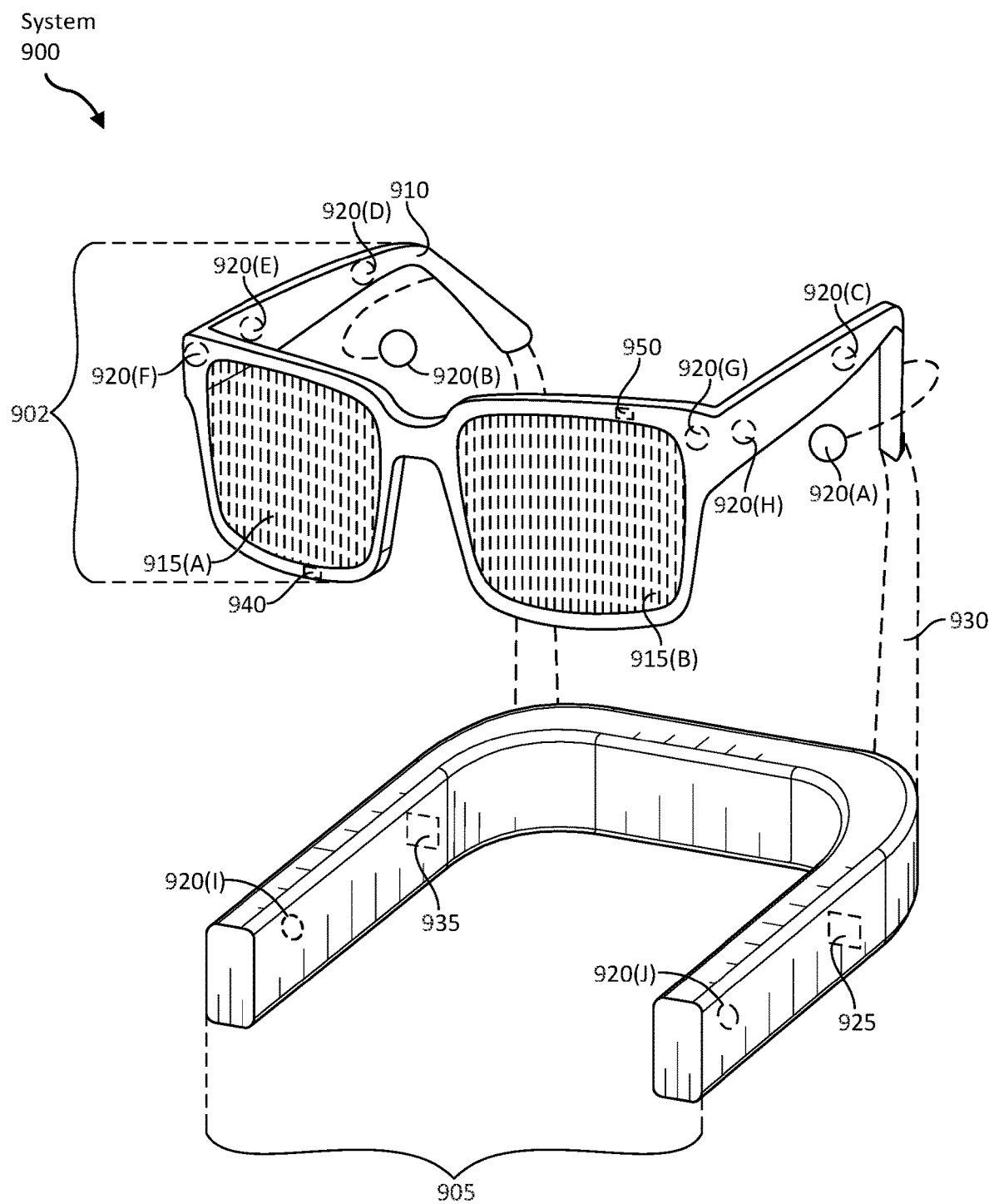
FIG. 9 is an illustration of example augmented-reality glasses that may be used in connection with embodiments of this disclosure.

The embodiments discussed in this disclosure may also be implemented in augmented-reality systems that include one or more NEDs. For example, as shown in FIG. 9, the augmented-reality system 900 may include an eyewear device 902 with a frame 910 configured to hold a left display device 915(A) and a right display device 915(B) in front of a user's eyes. The display devices 915(A) and 915(B) may act together or independently to present an image or series of images to a user. While the augmented-reality system 900 includes two displays, embodiments of this disclosure may be implemented in augmented-reality systems with a single NED or more than two NEDs.

In some embodiments, the augmented-reality system 900 may include one or more sensors, such as sensor 940. The sensor 940 may generate measurement signals in response to motion of the augmented-reality system 900 and may be located on substantially any portion of the frame 910. The sensor 940 may represent a position sensor, an inertial measurement unit (IMU), a depth camera assembly, or any combination thereof. In some embodiments, the augmented-reality system 900 may or may not include the sensor 940 or may include more than one sensor. In embodiments in which the sensor 940 includes an IMU, the IMU may generate calibration data based on measurement signals from the sensor 940. Examples of the sensor 940 may include, without limitation, accelerometers, gyroscopes, magnetometers, other suitable types of sensors that detect motion, sensors used for error correction of the IMU, or some combination thereof.

The augmented-reality system 900 may also include a microphone array with a plurality of acoustic transducers 920(A)-920(J), referred to collectively as acoustic transducers 920. The acoustic transducers 920 may be transducers that detect air pressure variations induced by sound waves. Each acoustic transducer 920 may be configured to detect sound and convert the detected sound into an electronic format (e.g., an analog or digital format). The microphone array in FIG. 9 may include, for example, ten acoustic transducers: 920(A) and 920(B), which may be designed to be placed inside a corresponding ear of the user, acoustic transducers 920(C), 920(D), 920(E), 920(F), 920(G), and 920(H), which may be positioned at various locations on the frame 910, and/or acoustic transducers 920(I) and 920(J), which may be positioned on a corresponding neckband 905.

In some embodiments, one or more of the acoustic transducers 920(A)-(F) may be used as output transducers (e.g., speakers). For example, the acoustic transducers 920(A) and/or 920(B) may be earbuds or any other suitable type of headphone or speaker.

The configuration of the acoustic transducers 920 of the microphone array may vary. While the augmented-reality system 900 is shown in FIG. 9 as having ten acoustic transducers 920, the number of acoustic transducers 920 may be greater or less than ten. In some embodiments, using higher numbers of acoustic transducers 920 may increase the amount of audio information collected and/or the sensitivity and accuracy of the audio information. In contrast, using a lower number of acoustic transducers 920 may decrease the computing power required by an associated controller 950 to process the collected audio information. In addition, the position of each acoustic transducer 920 of the microphone array may vary. For example, the position of an acoustic transducer 920 may include a defined position on the user, a defined coordinate on the frame 910, an orientation associated with each acoustic transducer 920, or some combination thereof.

The acoustic transducers 920(A) and 920(B) may be positioned on different parts of the user's ear, such as behind the pinna or within the auricle or fossa. Or, there may be additional acoustic transducers 920 on or surrounding the ear in addition to the acoustic transducers 920 inside the ear canal. Having an acoustic transducer 920 positioned next to an ear canal of a user may enable the microphone array to collect information on how sounds arrive at the ear canal. By positioning at least two of the acoustic transducers 920 on either side of a user's head (e.g., as binaural microphones), the augmented-reality device 900 may simulate binaural hearing and capture a 3D stereo sound field around about a user's head. In some embodiments, the acoustic transducers 920(A) and 920(B) may be connected to the augmented-reality system 900 via a wired connection 930, and in other embodiments, the acoustic transducers 920(A) and 920(B) may be connected to the augmented-reality system 900 via a wireless connection (e.g., a Bluetooth connection). In still other embodiments, the acoustic transducers 920(A) and 920(B) may not be used at all in conjunction with the augmented-reality system 900.

The acoustic transducers 920 on the frame 910 may be positioned along the length of the temples, across the bridge, above or below the display devices 915(A) and 915(B), or some combination thereof. The acoustic transducers 920 may be oriented such that the microphone array is able to detect sounds in a wide range of directions surrounding the user wearing the augmented-reality system 900. In some embodiments, an optimization process may be performed during manufacturing of the augmented-reality system 900 to determine relative positioning of each acoustic transducer 920 in the microphone array.

In some examples, the augmented-reality system 900 may include or be connected to an external device (e.g., a paired device), such as the neckband 905. The neckband 905 generally represents any type or form of paired device. Thus, the following discussion of the neckband 905 may also apply to various other paired devices, such as charging cases, smart watches, smart phones, wrist bands, other wearable devices, hand-held controllers, tablet computers, laptop computers and other external compute devices, etc.

As shown, the neckband 905 may be coupled to the eyewear device 902 via one or more connectors. The connectors may be wired or wireless and may include electrical and/or non-electrical (e.g., structural) components. In some cases, the eyewear device 902 and the neckband 905 may operate independently without any wired or wireless connection between them. While FIG. 9 illustrates the components of the eyewear device 902 and the neckband 905 in example locations on the eyewear device 902 and the neckband 905, the components may be located elsewhere and/or distributed differently on the eyewear device 902 and/or the neckband 905. In some embodiments, the components of the eyewear device 902 and the neckband 905 may be located on one or more additional peripheral devices paired with the eyewear device 902, the neckband 905, or some combination thereof.

Pairing external devices, such as the neckband 905, with augmented-reality eyewear devices may enable the eyewear devices to achieve the form factor of a pair of glasses while still providing sufficient battery and computation power for expanded capabilities. Some or all of the battery power, computational resources, and/or additional features of the augmented-reality system 900 may be provided by a paired device or shared between a paired device and an eyewear device, thus reducing the weight, heat profile, and form factor of the eyewear device overall while still retaining desired functionality. For example, the neckband 905 may allow components that would otherwise be included on an eyewear device to be included in the neckband 905 since users may tolerate a heavier weight load on their shoulders than they would tolerate on their heads. The neckband 905 may also have a larger surface area over which to diffuse and disperse heat to the ambient environment. Thus, the neckband 905 may allow for greater battery and computation capacity than might otherwise have been possible on a standalone eyewear device. Since weight carried in the neckband 905 may be less invasive to a user than weight carried in the eyewear device 902, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

The neckband 905 may be communicatively coupled with the eyewear device 902 and/or to other devices. These other devices may provide certain functions (e.g., tracking, localizing, depth mapping, processing, storage, etc.) to the augmented-reality system 900. In the embodiment of FIG. 9, the neckband 905 may include two acoustic transducers (e.g., 920(I) and 920(J)) that are part of the microphone array (or potentially form their own microphone subarray). The neckband 905 may also include a controller 925 and a power source 935.

The acoustic transducers 920(I) and 920(J) of the neckband 905 may be configured to detect sound and convert the detected sound into an electronic format (analog or digital). In the embodiment of FIG. 9, the acoustic transducers 920(I) and 920(J) may be positioned on the neckband 905, thereby increasing the distance between the neckband acoustic transducers 920(I) and 920(J) and other acoustic transducers 920 positioned on the eyewear device 902. In some cases, increasing the distance between the acoustic transducers 920 of the microphone array may improve the accuracy of beamforming performed via the microphone array. For example, if a sound is detected by the acoustic transducers 920(C) and 920(D) and the distance between the acoustic transducers 920(C) and 920(D) is greater than, e.g., the distance between the acoustic transducers 920(D) and 920 (E), the determined source location of the detected sound may be more accurate than if the sound had been detected by the acoustic transducers 920(D) and 920(E).

The controller 925 of the neckband 905 may process information generated by the sensors on the neckband 905 and/or the augmented-reality system 900. For example, the controller 925 may process information from the microphone array that describes sounds detected by the microphone array. For each detected sound, the controller 925 may perform a direction-of-arrival (DOA) estimation to estimate a direction from which the detected sound arrived at the microphone array. As the microphone array detects sounds, the controller 925 may populate an audio data set with the information. In embodiments in which the augmented-reality system 900 includes an inertial measurement unit, the controller 925 may compute all inertial and spatial calculations from the IMU located on the eyewear device 902. A connector may convey information between the augmented-reality system 900 and the neckband 905 and between the augmented-reality system 900 and the controller 925. The information may be in the form of optical data, electrical data, wireless data, or any other transmittable data form. Moving the processing of information generated by the augmented-reality system 900 to the neckband 905 may reduce weight and heat in the eyewear device 902, making it more comfortable to the user.

The power source 935 in the neckband 905 may provide power to the eyewear device 902 and/or to the neckband 905. The power source 935 may include, without limitation, lithium ion batteries, lithium-polymer batteries, primary lithium batteries, alkaline batteries, or any other form of power storage. In some cases, the power source 935 may be a wired power source. Including the power source 935 on the neckband 905 instead of on the eyewear device 902 may help better distribute the weight and heat generated by the power source 935.

As noted, some artificial-reality systems may, instead of blending an artificial reality with actual reality, substantially replace one or more of a user's sensory perceptions of the real world with a virtual experience. One example of this type of system is a head-worn display system, such as the virtual-reality system 1000 in FIG. 10, that mostly or completely covers a user's field of view. The virtual-reality system 1000 may include a front rigid body 1002 and a band 1004 shaped to fit around a user's head. The virtual-reality system 1000 may also include output audio transducers 1006(A) and 1006(B). Furthermore, while not shown in FIG. 10, the front rigid body 1002 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in the augmented-reality system 900 and/or the virtual-reality system 1000 may include one or more liquid crystal displays (LCDs), light-emitting diode (LED) displays, organic LED (OLED) displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial-reality systems may include one or more projection systems. For example, display devices in the augmented-reality system 900 and/or the virtual-reality system 1000 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. Artificial-reality systems may also be configured with any other suitable type or form of image projection system.

Artificial-reality systems may also include various types of computer vision components and subsystems. For example, the augmented-reality system 900, and/or the virtual-reality system 1000 may include one or more optical sensors, such as two-dimensional (2D) or 3D cameras, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIG. 10, 1006(A), and 1006(B) may include voice coil speakers, ribbon speakers, electrostatic speakers, piezoelectric speakers, bone conduction transducers, cartilage conduction transducers, and/or any other suitable type or form of audio transducer. Similarly, the input audio transducers may include condenser microphones, dynamic microphones, ribbon microphones, and/or any other type or form of input transducer. In some embodiments, a single transducer may be used for both audio input and audio output.

Figure 10:
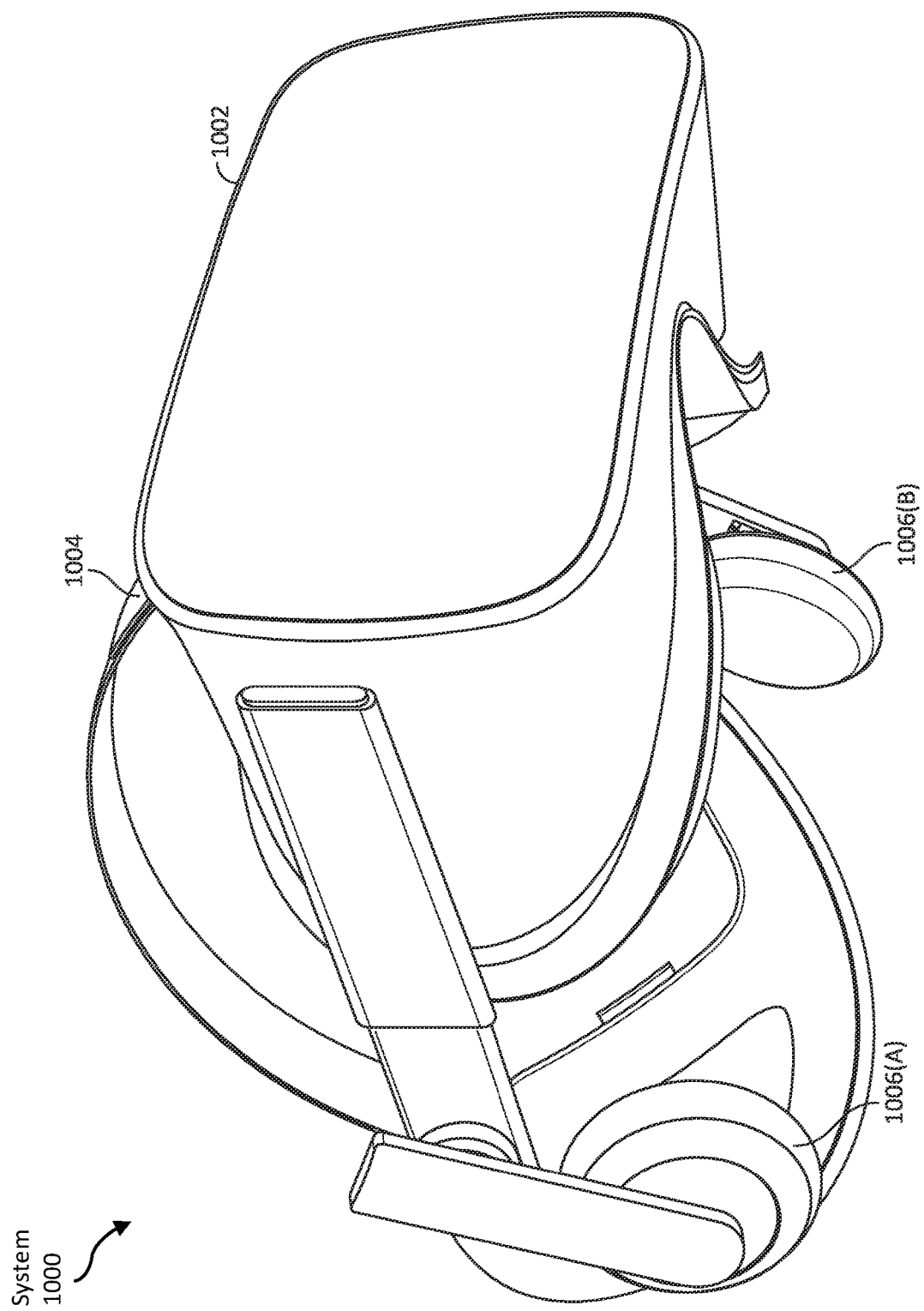
FIG. 10 is an illustration of an example virtual-reality headset that may be used in connection with embodiments of this disclosure.
Figure 11:
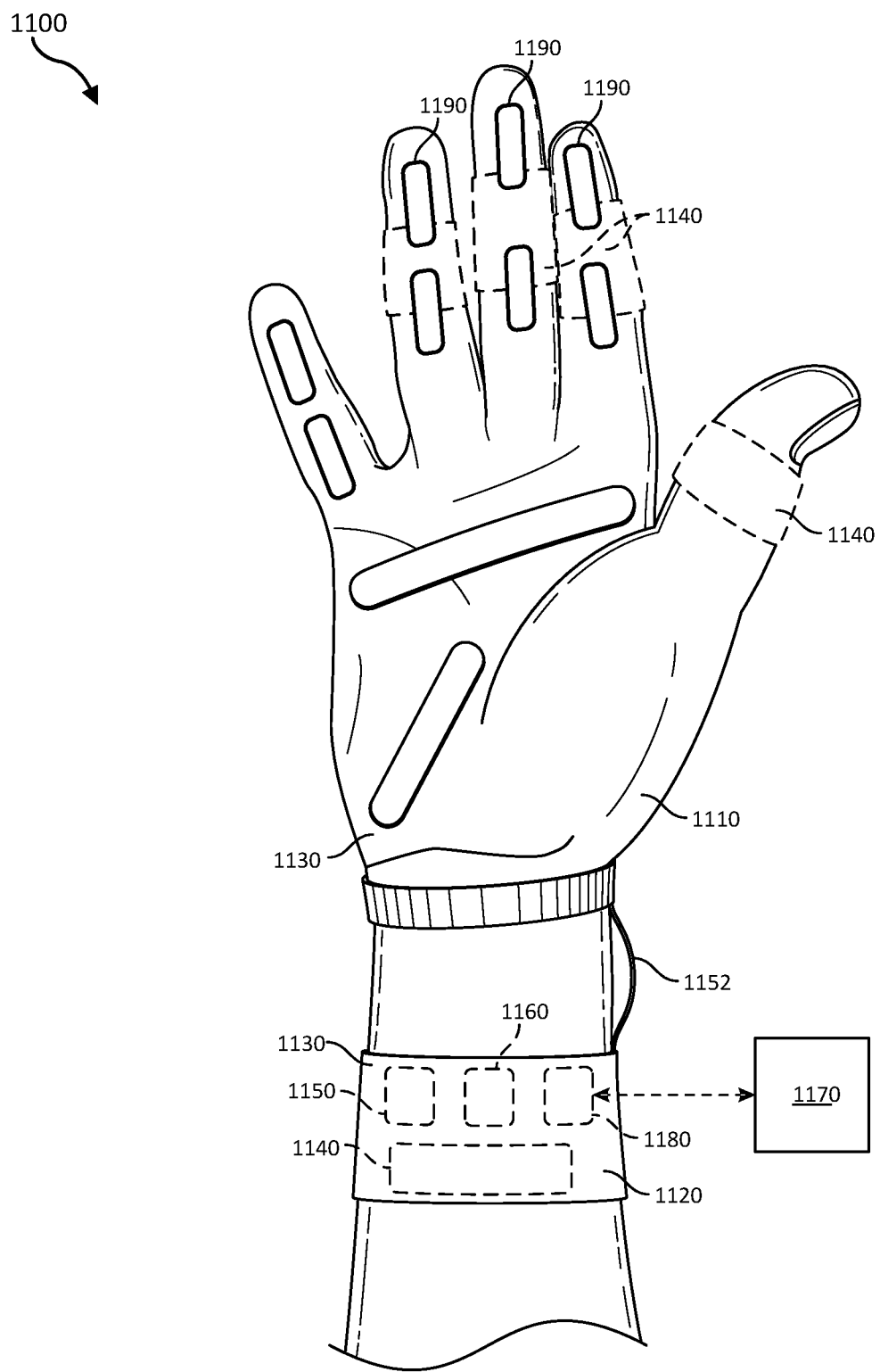
FIG. 11 is an illustration of example haptic devices that may be used in connection with embodiments of this disclosure.

While not shown in FIG. 10, artificial-reality systems may include tactile (i.e., haptic) feedback systems, which may be incorporated into headwear, gloves, body suits, handheld controllers, environmental devices (e.g., chairs, floormats, etc.), and/or any other type of device or system. By way of example and not limitation, any of the actuators 100, 211, 311, 411, 416, 504, 604, and 711 described above with reference to FIGS. 1-7 may be implemented in an artificial-reality system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial-reality experience in one or more of these contexts and environments and/or in other contexts and environments.

As noted, the artificial-reality systems 900, and 1000 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 11 illustrates a vibrotactile system 1100 in the form of a wearable glove (haptic device 1110) and wristband (haptic device 1120). The haptic device 1110 and the haptic device 1120 are shown as examples of wearable devices that include a flexible, wearable textile material 1130 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities.

One or more vibrotactile devices 1140 may be positioned at least partially within one or more corresponding pockets formed in the textile material 1130 of the vibrotactile system 1100. The vibrotactile devices 1140 may be positioned in locations to provide a vibrating sensation (e.g., haptic feedback) to a user of the vibrotactile system 1100. For example, the vibrotactile devices 1140 may be positioned to be against the user's finger(s), thumb, or wrist, as shown in FIG. 11. The vibrotactile devices 1140 may, in some examples, be sufficiently flexible to conform to or bend with the user's corresponding body part(s).

A power source 1150 (e.g., a battery) for applying a voltage to the vibrotactile devices 1140 for activation thereof may be electrically coupled to the vibrotactile devices 1140, such as via conductive wiring 1152. In some examples, each of the vibrotactile devices 1140 may be independently electrically coupled to the power source 1150 for individual activation. In some embodiments, a processor 1160 may be operatively coupled to the power source 1150 and configured (e.g., programmed) to control activation of the vibrotactile devices 1140.

The vibrotactile system 1100 may be implemented in a variety of ways. In some examples, the vibrotactile system 1100 may be a standalone system with integral subsystems and components for operation independent of other devices and systems. As another example, the vibrotactile system 1100 may be configured for interaction with another device or system 1170. For example, the vibrotactile system 1100 may, in some examples, include a communications interface 1180 for receiving and/or sending signals to the other device or system 1170. The other device or system 1170 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. The communications interface 1180 may enable communications between the vibrotactile system 1100 and the other device or system 1170 via a wireless (e.g., Wi-Fi, Bluetooth, cellular, radio, etc.) link or a wired link. If present, the communications interface 1180 may be in communication with the processor 1160, such as to provide a signal to the processor 1160 to activate or deactivate one or more of the vibrotactile devices 1140.

The vibrotactile system 1100 may optionally include other subsystems and components, such as touch-sensitive pads 1190, pressure sensors, motion sensors, position sensors, lighting elements, and/or user interface elements (e.g., an on/off button, a vibration control element, etc.). During use, the vibrotactile devices 1140 may be configured to be activated for a variety of different reasons, such as in response to the user's interaction with user interface elements, a signal from the motion or position sensors, a signal from the touch-sensitive pads 1190, a signal from the pressure sensors, a signal from the other device or system 1170, etc.

Although the power source 1150, the processor 1160, and the communications interface 1180 are illustrated in FIG. 11 as being positioned in the haptic device 1120, the present disclosure is not so limited. For example, one or more of the power source 1150, the processor 1160, or the communications interface 1180 may be positioned within the haptic device 1110 or within another wearable textile.

Figure 12:
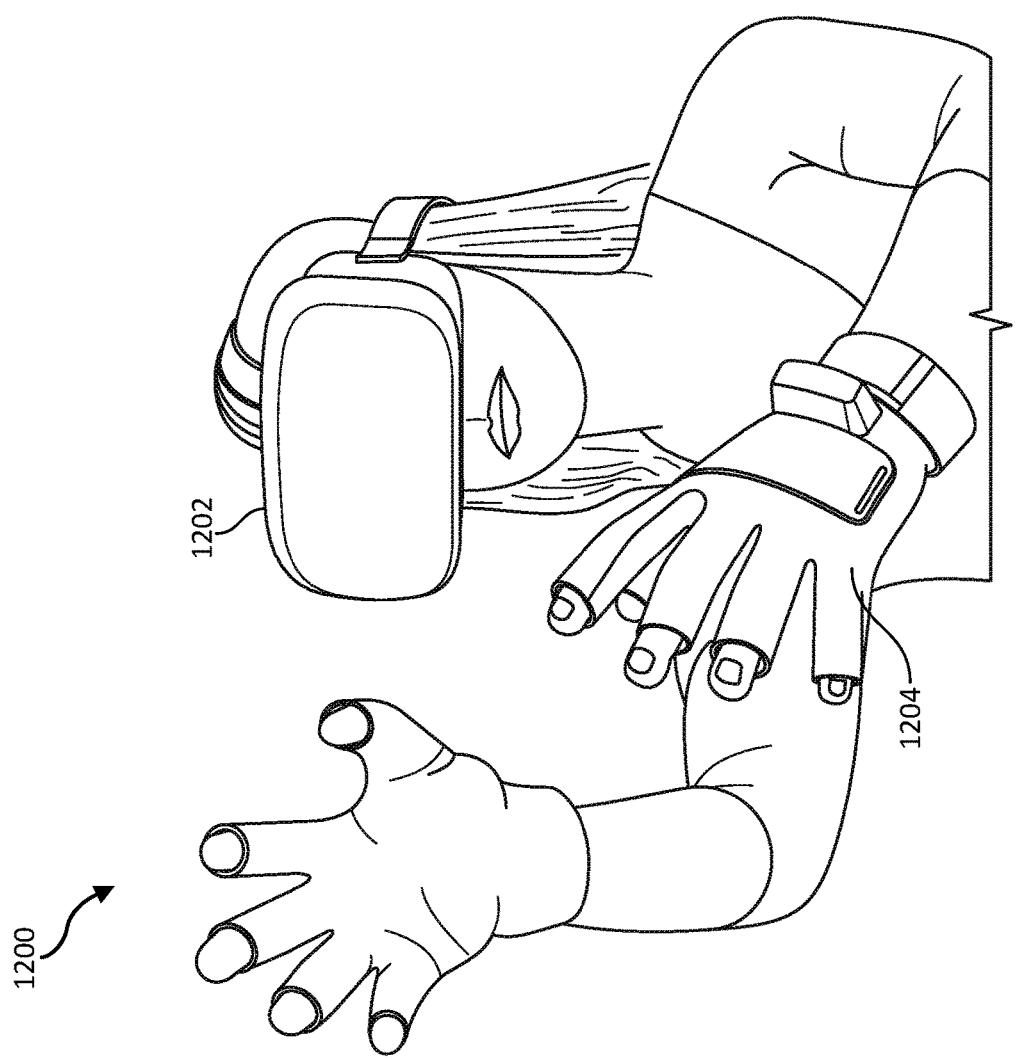
FIG. 12 is an illustration of an example virtual-reality environment according to embodiments of this disclosure.

Haptic wearables, such as those shown in and described in connection with FIG. 11, may be implemented in a variety of types of artificial-reality systems and environments. FIG. 12 shows an example artificial-reality environment 1200 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Head-mounted display 1202 generally represents any type or form of virtual-reality system, such as the virtual-reality system 1000 in FIG. 10. Haptic device 1204 generally represents any type or form of wearable device, worn by a use of an artificial-reality system, that provides haptic feedback to the user to give the user the perception that he or she is physically engaging with a virtual object. In some embodiments, the haptic device 1204 may provide haptic feedback by applying vibration, motion, and/or force to the user. For example, the haptic device 1204 may limit or augment a user's movement. To give a specific example, the haptic device 1204 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use the haptic device 1204 to send action requests to a console. Examples of action requests include, without limitation, requests to start an application and/or end the application and/or requests to perform a particular action within the application.

Figure 13:
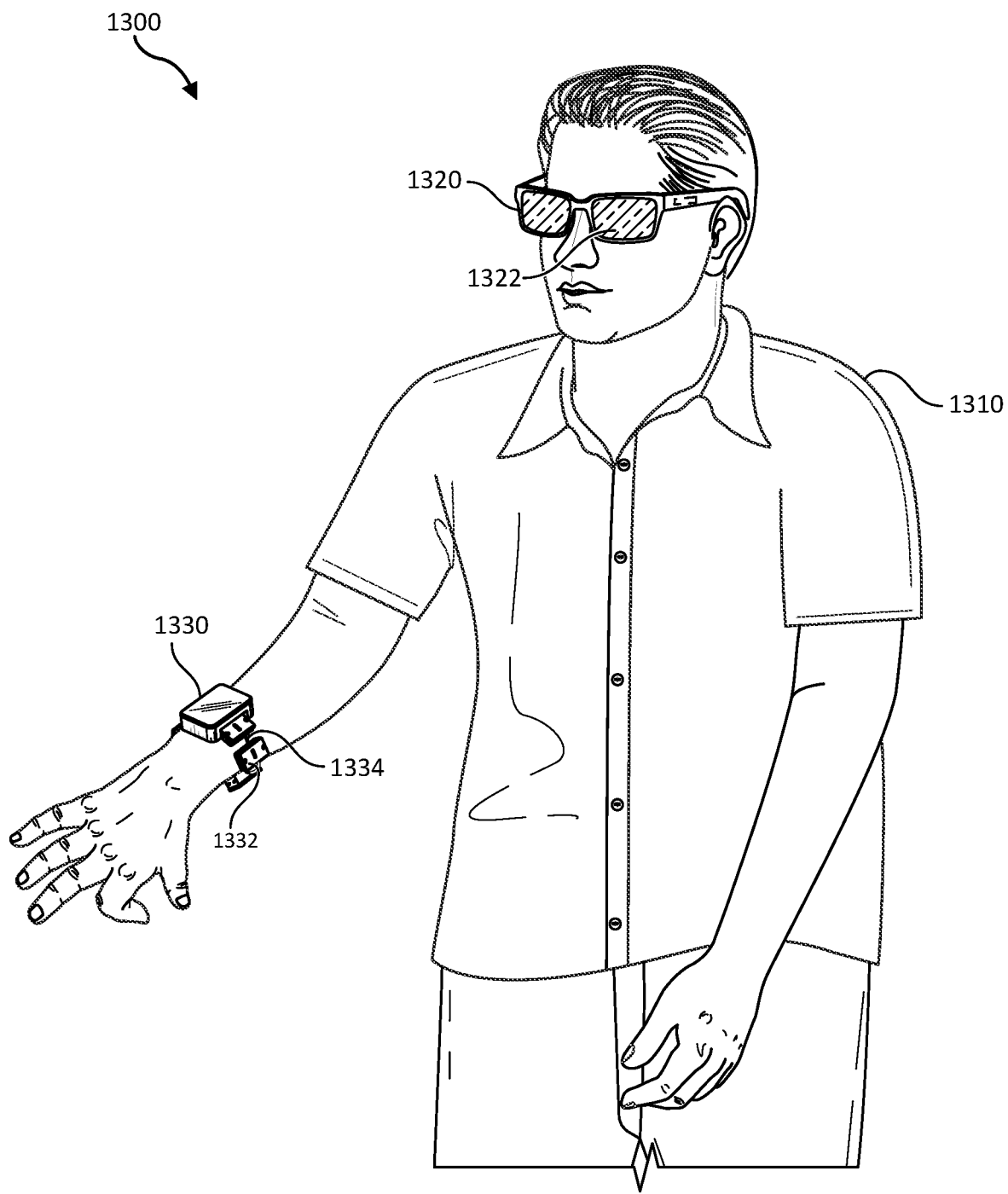
FIG. 13 is an illustration of an example augmented-reality environment according to embodiments of this disclosure.

While haptic interfaces may be used with virtual-reality systems, as shown in FIG. 12, haptic interfaces may also be used with augmented-reality systems, as shown in FIG. 13. FIG. 13 is a perspective view a user 1310 interacting with an augmented-reality system 1300. In this example, the user 1310 may wear a pair of augmented-reality glasses 1320 that have one or more displays 1322 and that are paired with a haptic device 1330. The haptic device 1330 may be a wristband that includes a plurality of band elements 1332 and a tensioning mechanism 1334 that connects band elements 1332 to one another.

One or more of the band elements 1332 may include any type or form of actuator suitable for providing haptic feedback. For example, one or more of the band elements 1332 may be configured to provide one or more of various types of cutaneous feedback, including vibration, force, traction, texture, and/or temperature. To provide such feedback, the band elements 1332 may include one or more of various types of actuators. In one example, each of the band elements 1332 may include a vibrotactor (e.g., a vibrotactile actuator, such as any of the actuators 100, 211, 311, 411, 416, 504, 604, and 711 described above) configured to vibrate in unison or independently to provide one or more of various types of haptic sensations to a user. Alternatively, only a single band element or a subset of band elements may include vibrotactors.

The haptic devices 1110, 1120, 1204, and 1330 may include any suitable number and/or type of haptic transducer, sensor, and/or feedback mechanism. For example, the haptic devices 1110, 1120, 1204, and 1330 may include one or more mechanical transducers, piezoelectric transducers, and/or fluidic transducers. The haptic devices 1110, 1120, 1204, and 1330 may also include various combinations of different types and forms of transducers that work together or independently to enhance a user's artificial-reality experience. In one example, each of the band elements 1332 of the haptic device 1330 may include a vibrotactor (e.g., a vibrotactile actuator) configured to vibrate in unison or independently to provide one or more of various types of haptic sensations to a user.

By way of non-limiting examples, the following embodiments are included in the present disclosure.

Example 1: A haptic vibrotactile actuator, including a textile comprising a first major surface and a second, opposite major surface, an electrode coupled to the first major surface of the textile across at least a majority of a surface area of a first surface of the electrode, and a flexible electroactive material electrically coupled to a second, opposite surface of the electrode.

Example 2: The haptic vibrotactile actuator of Example 1, wherein the electrode is a first electrode, further comprising a second electrode electrically coupled to a surface of the flexible electroactive material opposite the first electrode.

Example 3: The haptic vibrotactile actuator of Example 1 or Example 2, wherein the flexible electroactive material is a first flexible electroactive material, further comprising a second flexible electroactive material electrically coupled to the second electrode on a side of the second electrode opposite from the first flexible electroactive material, and a third electrode electrically coupled to the second flexible electroactive material on a side opposite from the second electrode.

Example 4: The haptic vibrotactile actuator of any of Examples 1 through 3, wherein the flexible electroactive material is a first flexible electroactive material, further comprising a third electrode coupled to the second, opposite major surface of the textile across at least a majority of a surface area of a first surface of the third electrode, a second flexible electroactive material electrically coupled to a second, opposite surface of the third electrode, and a fourth electrode electrically coupled to a surface of the second flexible electroactive material opposite the third electrode.

Example 5: The haptic vibrotactile actuator of any of Examples 1 through 4, further comprising a conductor coupled to the first major surface of the textile, wherein the conductor electrically couples the electrode to a haptic controller.

Example 6: The haptic vibrotactile actuator of any of Examples 1 through 5, wherein the flexible electroactive material is coupled to the first major surface of the textile via the electrode across substantially an entirety of a surface area of the flexible electroactive material.

Example 7: The haptic vibrotactile actuator of any of Examples 1 through 6, further comprising a flexible support material positioned between the electrode and the first major surface of the textile.

Example 8: The haptic vibrotactile actuator of any of Examples 1 through 7, wherein the electrode is coupled to the first major surface of the textile by at least one of a stenciling process, a three-dimensional printing process, a silk-screening process, a lamination process, an adhesion process, a printing process, or a chemical deposition process.

Example 9: The haptic vibrotactile actuator of any of Examples 1 through 8, wherein the electrode and the flexible electroactive material are coupled to each other by at least one of a stenciling process, a three-dimensional printing process, a silk-screening process, a lamination process, an adhesion process, a printing process, or a chemical deposition process.

Example 10: The haptic vibrotactile actuator of any of Examples 1 through 9, wherein the flexible electroactive material comprises at least one of an electroactive polymer material, a dielectric elastomer material, a relaxor ferroelectric material, a piezoelectric ceramic material, a piezoelectric polycrystalline material, or a piezoelectric single-crystal material.

Example 11: The haptic vibrotactile actuator of any of Examples 1 through 10, wherein the textile comprises at least one of a woven fabric, a non-woven fabric, leather, a cloth, a flexible polymer material, or a composite material.

Example 12: A system including a textile including a first major surface and a second, opposite major surface, a first electrode comprising a first surface coupled to the first major surface of the textile, a flexible electroactive material electrically coupled to a second, opposite surface of the first electrode, wherein the flexible electroactive material is configured to vibrate upon application of a voltage thereto, a second electrode electrically coupled to a surface of the flexible electroactive material opposite the first electrode, and a wearable article comprising the textile and supporting the flexible electroactive material in a position to induce haptic vibrational feedback to a user donning the wearable article.

Example 13: The system of Example 12, wherein the flexible electroactive material is a first flexible electroactive material, further comprising a second flexible electroactive material electrically coupled to the second electrode on a side of the second electrode opposite from the first flexible electroactive material, and a third electrode electrically coupled to the second flexible electroactive material on a side opposite from the second electrode.

Example 14: The system of Example 12 or Example 13, wherein the flexible electroactive material is a first flexible electroactive material, further comprising a third electrode coupled to the second, opposite major surface of the textile, a second flexible electroactive material electrically coupled to a second, opposite surface of the third electrode, and a fourth electrode electrically coupled to a surface of the second flexible electroactive material opposite the third electrode.

Example 15: The system of any of Examples 12 through 14, further comprising a flexible support material positioned between the first electrode and the first major surface of the textile.

Example 16: The system of any of Examples 12 through 15, wherein the first electrode and the flexible electroactive material are coupled to each other by at least one of a stenciling process, a three-dimensional printing process, a silk-screening process, a lamination process, an adhesion process, a printing process, or a chemical deposition process.

Example 17: The system of any of Examples 12 through 16, wherein the wearable article comprises at least one of a glove, a headband, a sleeve, a bracelet, a wristband, a watch band, a sock, a shoe, a neck band, a shirt, eyewear, a vest, a belt, or a hat.

Example 18: The system of any of Examples 12 through 17, further comprising a haptic controller communicatively coupled to a head-mounted display, wherein the haptic controller is configured to apply the voltage to the flexible electroactive material in connection with content presented on the head-mounted display.

Example 19: The system of any of Examples 12 through 18, further comprising at least one conductor coupled to the first major surface of the textile, wherein the at least one conductor electrically couples the first electrode and the second electrode to the haptic controller.

Example 20: A method including coupling a first surface of a first electrode to a major surface of a textile, electrically coupling a flexible electroactive material to a second, opposite surface of the first electrode, and electrically coupling a second electrode to a surface of the flexible electroactive material opposite the first electrode.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A system, comprising:
   a head-mounted display; and
   a vibrotactile actuator positioned on a textile, the vibrotactile actuator comprising:
      a flexible support material positioned on a surface of the textile;
      a first electrode coupled to the flexible support material on an opposite side of the flexible support material from the textile;
      a first electroactive material coupled to the first electrode on an opposite side of the first electrode from the flexible support material;
      a second electrode coupled to the first electroactive material on an opposite side of the first electroactive material from the first electrode; and
      a second electroactive material coupled to the second electrode on an opposite side of the second electrode from the first electroactive material, wherein:
   the head-mounted display is configured to send a control signal to induce application of a voltage to the first and second electroactive materials based on the control signal; and
   the first and second electroactive materials are configured to vibrate upon application of the voltage.

2. The system of claim 1, wherein the flexible support material comprises at least one of:
   a polymer material;
   a plastic material;
   an elastomer material; or
   a rubber material.

3. The system of claim 1, wherein the flexible support material comprises a non-porous material.

4. The system of claim 1, further comprising:
   a third electrode electrically coupled to the second electroactive material on a side of the second electroactive material opposite the second electrode.

5. The system of claim 1, wherein the flexible support material is a first flexible support material and the surface of the textile is a first surface of the textile, further comprising:

a second flexible support material positioned on a second, opposite surface of the textile;
a third electrode coupled to the second flexible support material on an opposite side of the second flexible support material from the textile;
a third electroactive material coupled to the third electrode on an opposite side of the third electrode from the second flexible support material; and
a fourth electrode coupled to the third electroactive material on an opposite side of the second electroactive material from the third electrode.

6. The system of claim 1, wherein the first electroactive material has a spiral shape.

7. The system of claim 1, wherein the textile comprises a textile of a wearable article.

8. The system of claim 1, further comprising a haptic controller, wherein:
the head-mounted display is configured to send the control signal to the haptic controller; and
the haptic controller is configured to apply the voltage to the first and second electroactive materials based on the control signal.

9. The system of claim 1, wherein the control signal is configured to induce vibration of the first and second electroactive materials in connection with artificial-reality content presented to a user on the head-mounted display.

10. The system of claim 1, wherein the textile comprises at least one of:
a woven fabric;
a non-woven fabric;
leather;
a cloth;
a flexible polymer material; or
a composite material.

11. A wearable article, comprising:
a textile shaped and sized to be worn on a body part of a user;
a flexible support material coupled to a surface of the textile;
an electrode coupled to the flexible support material;
a first electroactive material electrically coupled to the electrode, wherein the first electroactive material is configured to vibrate upon application of a voltage thereto with the electrode;
a second electroactive material positioned on a side of the first electroactive material opposite the electrode, wherein the first electroactive material and the second electroactive material are configured as a bimorph vibrotactile actuator; and
a communications interface configured to receive a control signal from another device to cause the voltage to be applied to the first and second electroactive materials.

12. The wearable article of claim 11, wherein the electrode is a first electrode, further comprising:
a second electrode coupled to the second electroactive material on a side of the second electroactive material opposite the first electrode.

13. The wearable article of claim 11, wherein each of the first electroactive material and second electroactive material comprises at least one of:
an electroactive polymer material;
a dielectric elastomer material;
a relaxor ferroelectric material;
a piezoelectric ceramic material;
a piezoelectric polycrystalline material; or
a piezoelectric single-crystal material.

14. The wearable article of claim 11, wherein the other device from which the control signal is received is a head-mounted display.

15. The wearable article of claim 11, wherein the flexible support material comprises an elastomer.

16. The wearable article of claim 11, further comprising an insulating material positioned between the first electroactive material and the second electroactive material.

17. The wearable article of claim 11, wherein the wearable article comprises at least one of:
a glove;
a headband;
a sleeve;
a bracelet;
a wristband;
a watch band;
a sock;
a shoe;
a neck band;
a shirt;
eyewear;
a vest;
a belt; or
a hat.

18. A system, comprising:
a head-mounted display; and
a vibrotactile actuator positioned on a textile, the vibrotactile actuator comprising:
a first flexible support material positioned on a first surface of the textile;
a first electrode coupled to the flexible support material on an opposite side of the flexible support material from the textile;
a first electroactive material coupled to the first electrode on an opposite side of the first electrode from the flexible support material;
a second electrode coupled to the electroactive material on an opposite side of the electroactive material from the first electrode;
a second flexible support material positioned on a second, opposite surface of the textile;
a third electrode coupled to the second flexible support material on an opposite side of the second flexible support material from the textile;
a second electroactive material coupled to the third electrode on an opposite side of the third electrode from the second flexible support material; and
a fourth electrode coupled to the second electroactive material on an opposite side of the second electroactive material from the third electrode, wherein:
the head-mounted display is configured to send a control signal to induce application of a voltage to the first and second electroactive materials based on the control signal; and
the first and second electroactive materials are configured to vibrate upon application of the voltage.

* * * * *